United States Patent [19]
Douglass

[11] Patent Number: 6,005,424
[45] Date of Patent: Dec. 21, 1999

[54] INTEGRATED POWER SWITCH FOR PARASITICALLY POWERED DEVICES

[75] Inventor: James M. Douglass, Carrollton, Tex.

[73] Assignee: Dallas Semiconductor Corp, Dallas, Tex.

[21] Appl. No.: 08/583,139

[22] Filed: Dec. 28, 1995

[51] Int. Cl.⁶ .......................... H03K 5/153; H03K 17/22
[52] U.S. Cl. ...................... 327/143; 327/108; 327/365; 327/198; 327/142; 327/512
[58] Field of Search ....................... 327/544, 545, 327/525, 365, 142, 143, 442, 108, 374, 387, 388, 512, 198

[56] References Cited

U.S. PATENT DOCUMENTS 5,075,569  12/1991  Branson .................................. 327/108
5,384,564  1/1995  Wycoff et al. ...................... 340/825.44

FOREIGN PATENT DOCUMENTS 2272908  11/1990  Japan ..................................... 327/324

*Primary Examiner*—Timothy P. Callahan
*Assistant Examiner*—Dinh T. Le
*Attorney, Agent, or Firm*—Jenkens & Gilchrist

[57] ABSTRACT

An integrated dynamic interconnect device for connecting and disconnecting at least a portion of a parasitically powered integrated electronic circuit, includes a power input, a power output, a signal input to receive a connect/disconnect signal, and an integrated switching mechanism which is responsive to the signal input receiving a connect/disconnect signal to electrically connect and disconnect the power input and the power output.

16 Claims, 3 Drawing Sheets

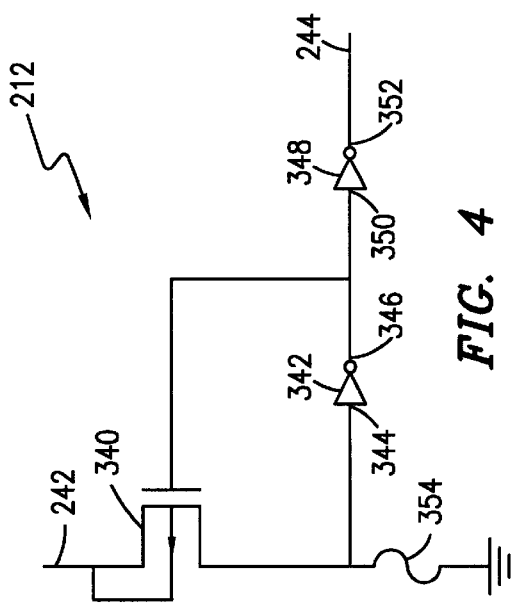
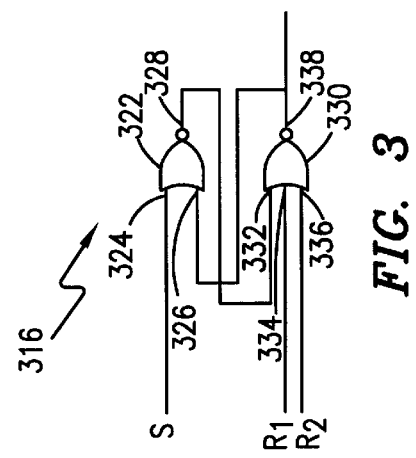
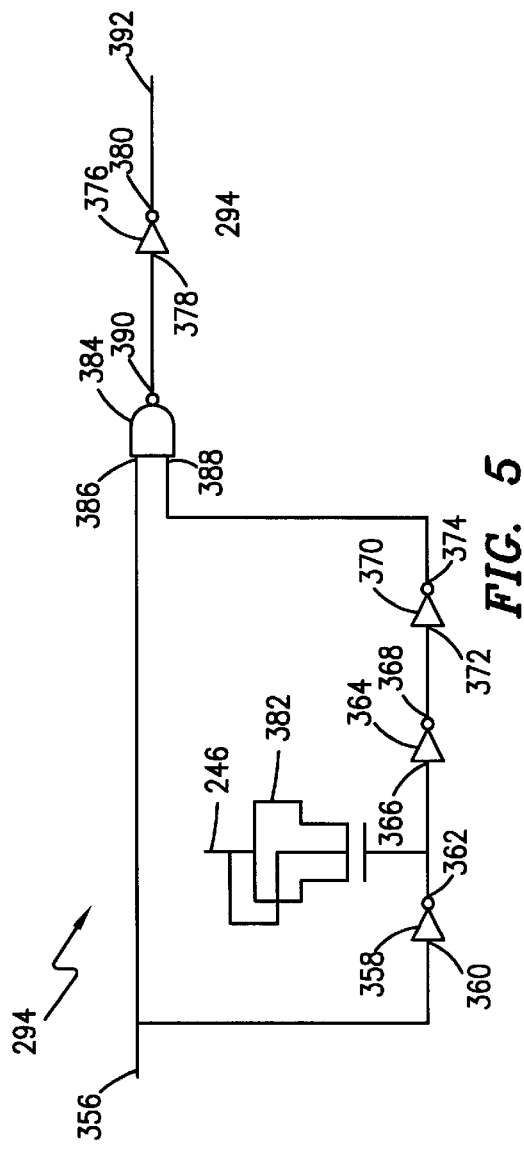
FIG. 3
FIG. 4
FIG. 5

INTEGRATED POWER SWITCH FOR PARASITICALLY POWERED DEVICES

PARTIAL WAVER OF COPYRIGHT PROTECTION

A portion of the disclosure of this patent document contains material which is subject to copyright protection. The copyright owner has no objection to the facsimile reproduction of the patent disclosure, as it appears in the United States Patent and Trademark office patent files or records, but otherwise reserves all copyright rights whatsoever.

FIELD OF THE INVENTION

This invention relates to switches, and more particularly, to integrated power switches for parasitically power integrated circuits.

BACKGROUND OF THE INVENTION

Parasitically powered electronic devices derive their power from the power transmitted over an attached data line. Generally, when the attached data line is at a high voltage, a capacitor on the electronic device (an "on-board power storage capacitor") is charged to the data line's potential. When the data goes to a low voltage, such as during communication, the device can no longer derive its power from the data line potential, therefore it is usually powered by the onboard power storage capacitor.

Parasitically powered electronic devices must be designed to minimize power consumption while the data line is at a low potential, so that the on-board power storage capacitor does not discharge too much, which could cause device circuitry to reset.

Current electronic design practices have brought the power consumption of many elements or parts to a very low level. The minimum power consumption level of any given device is determined at least in part by the amount of leakage current that flows through reverse-biased PN silicon diodes that are present on every MOSFET on the device. Since the reverse leakage current is proportional to the area of PN diode junctions, the smaller the area of the PN diode junctions, the lower the reverse leakage current. However, there is a limit as to how small the area of the PN diode junctions can be made, and further, even with the smallest PN diode junction area, the reverse leakage current increases exponentially with increased temperature.

In circumstances when the area of the PN diode junctions cannot be minimized or when the device is to function at high temperatures, such as when the device is designed to serve as a thermometer, the reverse leakage current that results often is too high, causing undesired power drain of the on-board power storage capacitor.

SUMMARY OF THE INVENTION

The present invention overcomes the above identified problems as well as other shortcomings and deficiencies of existing technologies by providing an integrated dynamic interconnect for a parasitically powered integrated electronic device. The interconnect minimizes power consumption of the electronic device by disconnecting portions of the electronic device when operation of those portions are not needed.

Accordingly, it is an object of the present invention to provide a power saving power switch for disconnecting portions of an electronic device when not in use.

It is another object of the present invention to provide a power switch to disconnect portions of a parasitically powered electronic device thereby minimizing leakage current in the device.

It is a further object of the present invention to provide a power saving power switch integrated with a parasitically powered electronic device.

It is yet another object of the present invention to provide a power saving power switch interconnected between a one wire interface and an electronic thermometer.

In accordance with the above and other objects there is provided an integrated dynamic interconnect for a parasitically powered integrated electronic circuit with a power input, a power output, a signal input for receiving connect/disconnect signals, and a switching device which responds to the signal input receiving the connect/disconnect signals by electrically connecting and disconnecting the power input and the power output.

BRIEF DESCRIPTION OF THE DRAWINGS

A more complete understanding of the present invention may be had by reference to the following Detailed Description when taken in conjunction with the accompanying Drawings wherein:

FIG. 3 is a schematic diagram of a latch set/reset utilized in a preferred embodiment of the present invention as similarly shown in FIG. 2;

FIG. 4 is a schematic diagram of a laser latch utilized in a preferred embodiment of the present invention as similarly shown in FIG. 2; and FIG. 5 is a schematic diagram of a one shot power pulse utilized in a preferred embodiment of the present invention as similarly shown in FIG. 2.

DETAILED DESCRIPTION OF THE PRESENTLY PREFERRED EXEMPLARY EMBODIMENTS

Figure 1:
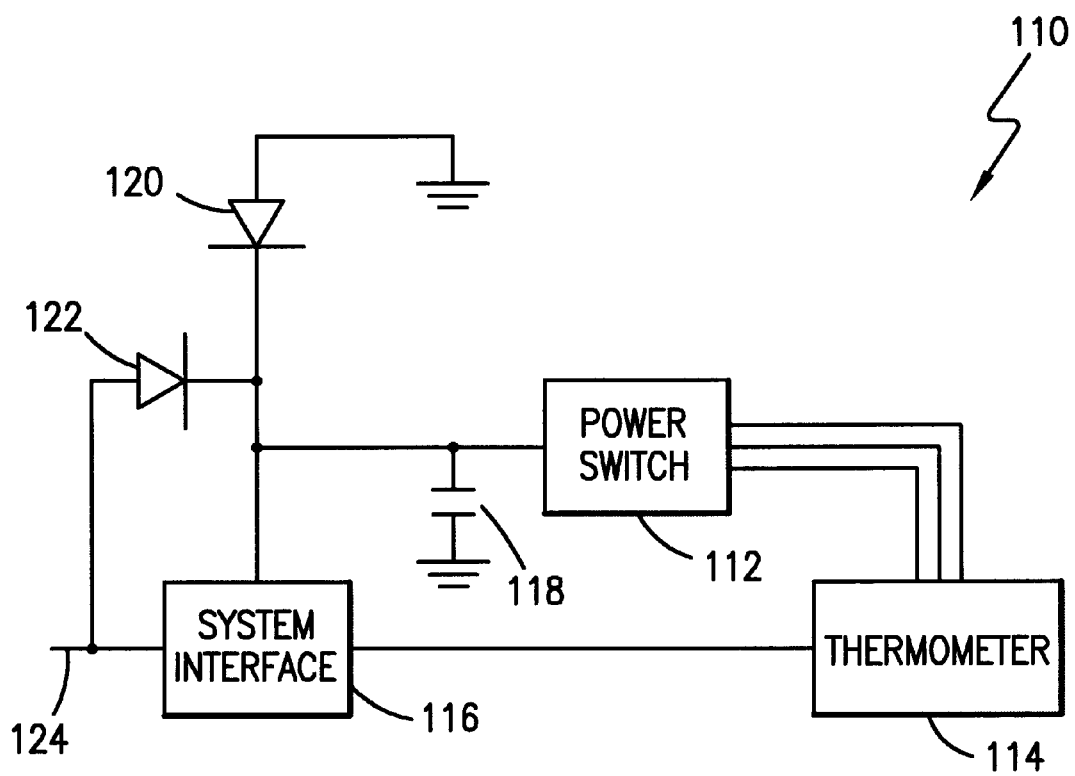
FIG. 1 is a schematic diagram of the present invention in the context of a thermometer system.

Referring now to FIG. 1, there is shown a schematic diagram of a system 110 in which the present invention is used in the context of a thermometer. The system 110 includes a power switch 112, a thermometer 114, a system interface 116, a capacitor 118, diodes 120 and 122, and an I/O port 124.

Diode 120 has one terminal connected to ground and the other terminal connected to power switch 112. Diode 122 has one terminal connected to the I/O port 124 of system 110 and the other terminal connected to power switch 112.

System interface 116 is interconnected between I/O port 124, power switch 112 and thermometer 114.

Thermometer 114 is interconnected between power switch 112 and system interface 116.

Capacitor 118 has one terminal connected to ground and the other terminal connected to power switch 112.

Good results have been achieved by using a Dallas Semiconductor one wire interface for system interface 116 and a Dallas Semiconductor thermometer such as the DS1620 for thermometer 114.

It is contemplated to be within the scope of this invention that all the components of system 110 could be either integrated in one die or could be a combination of electronic devices.

Figure 2:
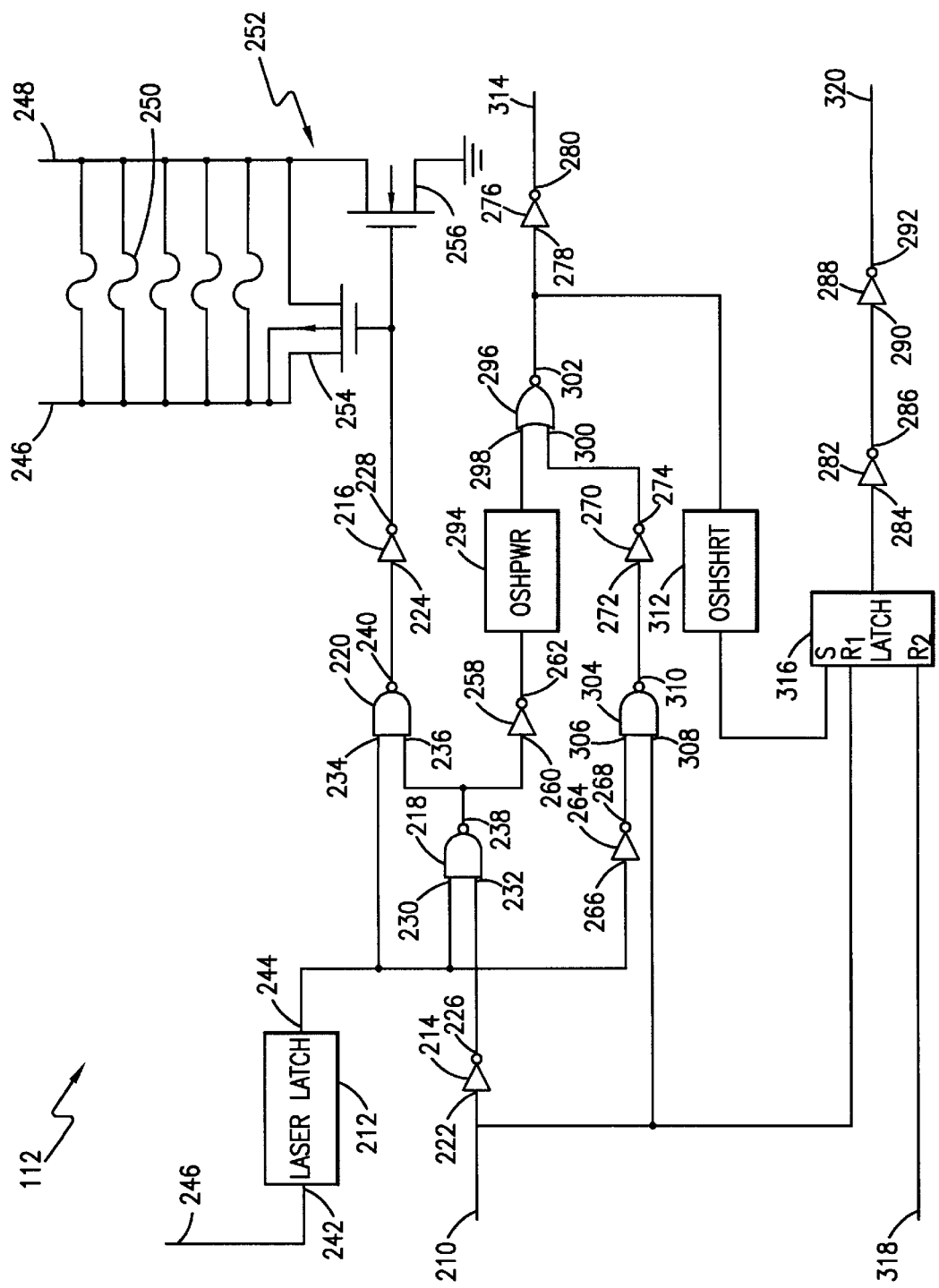
FIG. 2 is a schematic diagram of a preferred embodiment of the present invention.

Referring now to FIG. 2, there is shown a schematic diagram of a preferred embodiment of power switch 112 as similarly shown in FIG. 1. Power switch 112 includes a power-up terminal 210, a laser latch 212, inverters 214 and 216, and NAND gates 218 and 220. Each of inverters 214 and 216 have inputs 222 and 224 and outputs 226 and 228, respectively. NAND gates 218 and 220 each have two inputs 230, 232 and 234, 236 and outputs 238 and 240, respectively.

Power-up terminal 210 is connected between system interface 116 (see FIG. 1) and input 222 of inverter 214. Output 226 of inverter 214 is connected to input 232 of NAND gate 218. Laser latch 212 has an input 242 and an output 244 with input 242 connected to a power input terminal 246, and output 244 connected to inputs and 230 and 234 of NAND gates 218 and 220, respectively.

Output 238 of NAND gate 218 is connected to input 236 of NAND gate 220, while output 240 of NAND gate 220 is connected to input 224 of inverter 216.

Power switch 112 further includes a power output terminal 248, multiple fuses, such as fuse 250, and a CMOS inverter 252 having a p-channel MOS transistor 254 and an n-channel MOS transistor 256. The multiple fuses connect power input terminal 246 to the power output terminal 248, and if not blown provide an electrical connection between power input terminal 246 and power output terminal 248, thereby overriding the power switch 112.

The gates of p-channel transistor 254 and n-channel transistor 256 are both connected to output 228 of inverter 216. The drain of p-channel transistor 254 is connected to the power input terminal 246 and the source of n-channel transistor 266 is connected to ground. The source of p-channel transistor and the drain of n-channel transistor are both connected to power output terminal 248. Power output terminal 248 is also connected to thermometer 114 (see FIG. 1).

Power switch 112 further includes inverters 258, 264, 270, 276, 282 and 288, each having an input 260, 266, 272, 278, 284 and 290, and each having an output 262, 268, 274, 280, 286 and 292, respectively; a one shot power pulse or oshpwr 294; a NOR gate 296 having inputs 298 and 300 and an output 302; a NAND gate 304 having inputs 306 and 308 and an output 310; a one shot short or oshshrt 312; a reset terminal 314; a latch 316; a power on reset terminal 318; and a reset complete terminal 320.

Input 260 of inverter 258 is connected to output 238 of NAND gate 218 and output 262 of inverter 258 is connected to oshpwr 294. Input 298 of NOR gate 296 is connected to oshpwr 294 and input 300 of NOR gate 296 is connected to output 274 of inverter 270. Output 302 of NOR gate 296 is connected to input 278 of inverter 276 and to oshshrt 312.

Input 266 of inverter 264 is connected to output 244 of laser latch 212, and output 268 of inverter 264 is connected to input 306 of NAND gate 304. Input 308 of NAND gate 304 is connected to power-up terminal 210, and output 310 of NAND gate 304 is connected to input 272 of inverter 270.

Output 280 of inverter 276 is connected to the power-on reset or POR terminal 314 which is connected to thermometer 114 (see FIG. 1).

Latch 316 is connected to the power-on reset or POR terminal 318, power-up terminal 210, oshshrt 312, and input 284 of inverter 282. POR terminal 318 is connected to system interface 116 (see FIG. 1).

Output 286 of inverter 282 is connected to input 290 of inverter 288. Output 292 of inverter 288 is connected to power on reset complete terminal 320 which is also connected to system interface 116.

Referring now to FIG. 3, there is shown a preferred schematic of latch 316 as shown in FIG. 2, including two NOR gates 322 and 330. NOR gate 322 includes inputs 324 and 326 and output 328. NOR gate 330 includes inputs 332, 334 and 336 and output 338. Input 324 of NOR gate 322 is connected to oshshrt 312 (see FIG. 2) and input 326 of NOR gate 322 is connected to output 338 of NOR gate 330. Output 328 of NOR gate 322 is connected to input 332 of NOR gate 330.

Inputs 334 and 336 of NOR gate 330 are connected to power-up terminal 210 and POR 318 respectively (see FIG. 2). Output 338 of NOR gate 330 is also connected to input 284 of inverter 286 (see FIG. 2).

Referring now to FIG. 4, there is shown a preferred schematic diagram of laser latch 212 as shown in FIG. 2, including a p-channel MOS transistor 340, inverters 342 and 348, and a fuse 354. Inverters 342 and 348 include inputs 344 and 350 and outputs 346 and 352, respectively. The drain of transistor 340 is connected to input 242, the gate is connected to output 346 of inverter 342 and to input 350 of inverter 348, and the source is connected to fuse 354 and input 344 of inverter 342. Fuse 354 is also connected to ground, and like the fuses shown in FIG. 2, need to be blown to activate power switch 112.

Output 346 of inverter 342 is connected to input 350 of inverter 348, with output 352 of inverter 348 connected to output 244.

Referring now to FIG. 5, there is shown a preferred schematic diagram of oshpwr 294 as shown in FIG. 2, including an input terminal 356, inverters 358, 364, 370, and 376, a p-depletion MOSFET capacitor 382, a NAND gate 384, and an output terminal 392. Inverters 358, 364, 370 and 376, include inputs 360, 366, 372, and 378, and outputs 362, 368, 374, and 380, respectively. NAND gate 384 includes inputs 386 and 388, and output 390.

Input terminal 356 connects output 262 of inverter 258 (see FIG. 2) to input 386 of NAND gate 384 and input 360 of inverter 358. Output 362 of inverter 358 is connected to the gate of capacitor 382 and input 366 of inverter 364. Output 368 of inverter 364 is connected to input 372 of inverter 370, and output 374 of inverter 370 is connected to input 388 of NAND gate 384. Output 390 of NAND gate 384 is connected to input 378 of inverter 376. Output terminal 392 connects output 380 of inverter 376 with input 298 of NOR gate 296 (see FIG. 2). The drain and source of capacitor 382 are connected to power input terminal 246.

OPERATION

Referring now to FIGS. 1–5, the operation of the present invention in the context of the system as shown in FIG. 1 will now be described.

Referring to FIG. 1, in this embodiment, system 110 is an integrated parasitically powered electronic device that derives its power from a data line which would be connected to I/O port 124. When the data line is at a high voltage, system 110 is powered from the power supplied by the data line through diode 122 with capacitor 118 also being charged to the data line's potential. When the data line is at a low voltage, such as during communication, system 110 is powered by previously charged capacitor 118.

In operation, I/O port 124 is connected to a data line which is connected to a computer or other device so that a temperature reading from thermometer 114 can be taken.

When connected, system 110 will derive its power from that data line when no communication is taking place between system 110 and the computer. Also, during this time, capacitor 118 is being charged to the data line's potential.

When communication between system 110 and the computer is taking place, system 110 derives its power from charged capacitor 118. To minimize the power consumption of system 110, including power consumption caused by leakage current, and especially when being powered by capacitor 118, power switch 112 can disconnect thermometer 114 from power when it is not needed. For example, when system 110 is connected to a data line and receives a request for a temperature reading, a signal is sent by the system interface 116 to power switch 112 to connect and power-up thermometer 114. Once thermometer 114 has completed its task, system interface 116 sends a signal to power switch 112 to disconnect thermometer 114 from power.

Referring now to FIG. 2, the fuses connecting power input terminal 246 with power output terminal 248 must be blown, along with fuse 354 in laser latch 212 (see FIG. 4) in order for power switch 112 to be active. When power-up terminal 210 receives a "power up" signal from system interface 116, which in this case is a low signal or a zero, inverter 216 outputs a low signal or a zero, essentially shorting the drain and the source of p-channel transistor 254, connecting power input terminal 246 with power output terminal 248, thereby supplying power to thermometer 114.

At this time, a signal is generated by oshpwr 294 such that a reset signal is sent to thermometer 114 from reset terminal 314. After a predetermined amount of time, a minimum time such that thermometer has time to reset, oshshrt 312 generates a signal, such that a reset complete signal is sent to system interface 116 through reset complete terminal 320. This notifies the system interface 116 that the temperature circuitry of thermometer 114 is active.

When the temperature circuitry of thermometer 114 completes its operation, system interface 116 sends a high signal or a power-down signal to power-up terminal 210. Inverter 216 then outputs a high signal essentially opening the drain and the source of p-channel transistor 254 disconnecting power input terminal 246 from power output terminal 248, and closing the drain and the source of n-channel transistor 256, such that any power being input to input power terminal 246 is pulled to ground. This completely shuts off the temperature circuitry of thermometer 114. Also at this time, the signal at reset complete terminal 320 goes low, indicating to system interface 116 the temperature circuitry of thermometer 114 is no longer active.

Good results have been achieved by limiting the generation of a power up signal, a low signal, by system interface 116 to when the data line connected to system 110 is at a high voltage. This ensures that all of the circuitry of system 110 can be powered from the data line. Likewise, the power-up signal from system interface 116 must go back high to disconnect the temperature circuitry of thermometer 114 before the data line goes low. This limits the amount of power drain on capacitor 118 by only allowing the temperature circuitry of thermometer 114 to be powered parasitically by the data line.

Although system 110 is parasitically powered, it is contemplated to be within the scope of this invention that power switch 112 could be integrated or incorporated with virtually any type of electronic component regardless of how it is powered, especially for devices where minimum power consumption is critical and for devices that have portions that can be disconnected from the power source for periods of time.

CONCLUSION

Although a preferred embodiment of the present invention has been illustrated in the accompanying Drawings and described in the foregoing Detailed Description, it will be understood that the invention is not limited to the embodiment disclosed, but is capable of numerous rearrangements, modifications and substitutions without departing from the spirit of the invention as set forth and defined by the following claims.

What is claimed is:

1. A dynamic switch for connecting and disconnecting an integrated electronic circuit from a power source, said dynamic switch comprising:

a power input for electrically connecting to the power source;

a power output for electrically connecting to said integrated electronic circuit;

a first signal input for receiving connect/disconnect signals;

a first means responsive to said first signal input receiving a connect/disconnect signal for electrically connecting and disconnecting said power input and said power output; and said first means including a first inverter, a first NAND gate, and a second NAND gate, said first inverter having an input and an output, and each of said first NAND gate and said second NAND gate having first and second inputs, and an output, said input of said first inverter electrically connected to said first signal input, said output of said first inverter electrically connected to said second input of said first NAND gate, said first input of said first NAND gate electrically connected to the power source and said output of said first NAND gate electrically connected to said second input of said second NAND gate.

2. A dynamic switch as recited in claim 1, wherein:

said first means further includes a latch coupled between the power source and said first input of said first NAND gate, said latch having an input and an output, said input of said latch being electrically connected to the power source and said output being connected to said first input of said first NAND gate.

3. A dynamic switch as recited in claim 2, wherein:

said output of said latch is electrically connected to said first input of said second NAND gate.

4. A dynamic switch as recited in claim 3, wherein:

said first means further includes a second inverter having a input and an output, said output of said second NAND gate electrically connected to said input of said second inverter.

5. A dynamic switch as recited in claim 4, wherein:

said first means further includes a CMOS inverter having an input, an output, a positive voltage terminal and a negative voltage terminal; and said input of said CMOS inverter being electrically connected to said output of said second inverter, said positive voltage terminal being electrically connected to the power source, said output of said CMOS inverter being electrically connected to said power output, and said negative voltage terminal being electrically connected to ground.

6. A dynamic switch as recited in claim 5, further comprising:

a second means connected between said power input and said power output for preventing the disconnection of said power input from said power output.

7. A dynamic switch as recited in claim 6, wherein:
said second means includes at least one fuse coupled to said power input and said power output.

8. A dynamic switch as recited in claim 2, wherein:
said latch includes a fuse.

9. In an integrated thermometer, a switching device for connecting and disconnecting at least a portion of the integrated thermometer, said switching device comprising:
   a power input for receiving power from a power source;
   a power output electrically connected to said at least a portion of the integrated thermometer;
   a first signal input for receiving connect/disconnect signals;
   a switching means, responsive to said first signal input receiving connect/disconnect signals, said switching means electrically connected between said power input and said power output for electrically connecting and disconnecting said at least a portion of the integrated thermometer from the power source;
   said switching means including a first inverter having an input and an output, said input of said first inverter electrically connected to said first signal input; and
   said switching means further including a first NAND gate and a second NAND gate, said each of said first and second NAND gates having a first and a second input and an output, said first input of said first NAND gate electrically connected to said power input, and said second input of said first NAND gate electrically connected to said output of said first inverter, and said output of said first NAND gate electrically connected to said second input of said second NAND gate.

10. A switching device as recited in claim 9, wherein:
said switching device further includes a latch having an input and an output, said input being electrically connected to the power source and said output being electrically connected to said first input of said first NAND gate.

11. A switching device as recited in claim 10, wherein:
said switching means further includes a second NAND gate having first and second inputs and an output; and
said output of said latch electrically connected to said first input of said second NAND gate and said output of said first NAND gate electrically connected to said second input of said second NAND gate.

12. A switching device as recited in claim 11, wherein:
said switching means further includes a second inverter having a input and an output, said output of said second NAND gate electrically connected to said input of said second inverter.

13. A switching device as recited in claim 12, wherein:
said switching means further includes a CMOS inverter having an input, an output, a positive voltage terminal and a negative voltage terminal; and
said input being electrically connected to said output of said second inverter, said positive voltage terminal being electrically connected to the power source, said output of said CMOS inverter being electrically connected to said power output, and said negative voltage terminal being electrically connected to ground.

14. A switching device as recited in claim 13, further comprising:
a bypass connecting means connected between said power input and said power output for preventing the disconnection of said at least a portion of said integrated thermometer.

15. A switching device as recited in claim 14, wherein:
said bypass connecting means includes at least one fuse electrically connecting said power input with said power output.

16. A switching device as recited in claim 15, wherein:
said bypass connecting means includes a fuse electrically connected between said latch and ground.

* * * * *